(12) United States Patent
Kuo et al.

(10) Patent No.: US 8,930,858 B1
(45) Date of Patent: Jan. 6, 2015

(54) METHOD FOR OPTICAL PROXIMITY CORRECTION

(71) Applicant: United Microelectronics Corp., Hsin-Chu (TW)

(72) Inventors: Hui-Fang Kuo, Tainan (TW); Ming-Jui Chen, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/091,345

(22) Filed: Nov. 27, 2013

(51) Int. Cl.
*G06F 17/50* (2006.01)

(52) U.S. Cl.
CPC .................................... *G06F 17/50* (2013.01)
USPC ........................................................ 716/53

(58) Field of Classification Search
CPC ............ G01N 21/9501; G03F 7/70625; G06F 17/5081; G06F 2217/12
USPC .................................................... 716/100, 53
See application file for complete search history.

(56) References Cited

U.S. PATENT DOCUMENTS

| | | | |
|---|---|---|---|
| 6,033,811 A | 3/2000 | Lee | |
| 6,395,438 B1 | 5/2002 | Bruce | |
| 6,470,489 B1 | 10/2002 | Chang | |
| 6,684,382 B2 | 1/2004 | Liu | |
| 6,753,115 B2 | 6/2004 | Zhang | |
| 6,763,514 B2 | 7/2004 | Zhang | |
| 6,852,453 B2 | 2/2005 | Wu | |
| 6,961,920 B2 | 11/2005 | Zach | |
| 7,324,214 B2 * | 1/2008 | De Groot et al. | 356/511 |
| 7,386,829 B2 | 6/2008 | Lee | |
| 7,487,490 B2 * | 2/2009 | Zhang et al. | 716/50 |
| 7,624,369 B2 | 11/2009 | Graur | |
| 7,948,636 B2 * | 5/2011 | De Groot et al. | 356/511 |
| 2005/0223350 A1 * | 10/2005 | Zhang et al. | 716/21 |
| 2006/0066339 A1 | 3/2006 | Rajski | |
| 2006/0085772 A1 | 4/2006 | Zhang | |
| 2006/0161452 A1 | 7/2006 | Hess | |
| 2007/0046953 A1 * | 3/2007 | De Groot et al. | 356/512 |
| 2008/0266574 A1 * | 10/2008 | Groot et al. | 356/511 |
| 2009/0193385 A1 | 7/2009 | Yang | |
| 2009/0241087 A1 * | 9/2009 | Zhang et al. | 716/21 |
| 2009/0278569 A1 | 11/2009 | Taoka | |
| 2009/0300576 A1 | 12/2009 | Huang | |
| 2010/0036644 A1 | 2/2010 | Yang | |
| 2010/0070944 A1 | 3/2010 | Wu | |
| 2010/0086862 A1 | 4/2010 | Yang | |
| 2010/0131914 A1 | 5/2010 | Wu | |
| 2010/0175041 A1 | 7/2010 | Krasnoperova | |
| 2010/0265516 A1 * | 10/2010 | De Groot et al. | 356/511 |
| 2011/0029939 A1 | 2/2011 | Yang | |

* cited by examiner

*Primary Examiner* — Suresh Memula
(74) *Attorney, Agent, or Firm* — Winston Hsu; Scott Margo

(57) ABSTRACT

A smooth process is provided in the present invention. The smooth process is applied to a retarget layout, wherein the retarget layout is dissected into a plurality of segments. Furthermore, the retarget layout comprises a first original pattern, a first adding pattern and a second adding pattern. The smooth process includes changing the second adding pattern to a first smooth pattern. Latter, a second smooth pattern is added to extend from a bottom of the first smooth pattern and a tail portion of the first adding pattern is shrunk to a third smooth pattern. After the smooth process, an optical proximity correction process is applied to the smooth layout to produce an optical proximity correction layout.

22 Claims, 8 Drawing Sheets

METHOD FOR OPTICAL PROXIMITY CORRECTION

BACKGROUND OF THE INVENTION

1. Field of the Invention

The present invention relates generally to a method for optical proximity correction and, more particularly, to a method for modifying a retarget layout before an optical proximity correction process is applied to the retarget layout.

2. Description of the Prior Art

As integration densities on a semiconductor chips continue to increase at an exponential rate, it is becoming progressively harder to deal with optical effects that arise during the optical lithography process involved in manufacturing the semiconductor chips. These optical effects can cause unwanted distortions in the printed pattern that is generated by the optical lithography process.

To address the problem, an original pattern is often subjected to an optical proximity correction (OPC) operation, which adjusts the pattern to compensate for optical effects. For example, edges in the original pattern may be adjusted to make certain portions of the geometric elements larger or smaller, in accordance with how much additional light exposure is desired at certain points on the substrate. When these adjustments are appropriately calibrated, proximity effects are reduced and overall pattern fidelity is greatly improved While OPC corrections are commonly applied to the original patterns, it has been pointed out that current OPC techniques cannot guarantee sufficiently process windows for original patterns with increasing integration. Some attempts have been made at improving process windows for specific features by applying a pre-OPC process to the original pattern to get a pre-OPC modified pattern. After the pre-OPC process, the pre-OPC modified pattern may generate new shapes such as assist features on the pattern that provide for improved printability. After the retarget process, a retarget pattern is formed. The retarget process is for improving the process window during the etching process or compensating the loading of the photoresist in a dense region and an isolation region. However, it has been noticed that light intensity varied greatly between dense region and isolation region of the retarget pattern, which may cause defects on the printed pattern.

SUMMARY OF THE INVENTION

Bearing in mind the problems and deficiencies of the prior art, it is therefore an object of the present invention to provide a novel optical proximity correction process.

It is one object of the present invention to provide a method for optical proximity correction. The method includes obtaining a retarget layout after a retarget process, wherein the retarget layout is dissected into a plurality of segments, and the retarget layout comprises a first original pattern, a first adding pattern and a second adding pattern. Then, a computer is utilized to calculate a distance between adjacent parallel segments, if the distance is greater than a first predetermined value, processing a smooth process to modify the retarget layout to generate a smooth layout, wherein the smooth process comprises the steps of:
changing the second adding pattern to a first smooth pattern. Latter, a second smooth pattern is added to extend from a bottom of the first smooth pattern and a tail portion of the first adding pattern is shrunk to a third smooth pattern, and the tail portion of the first adding pattern connecting to a top of the first smooth pattern. After the smooth process, an optical proximity correction process is applied to the smooth layout to produce an optical proximity correction layout.

In another aspect, the present invention provides a method for optical proximity correction. The method comprises obtaining a retarget layout after a retarget process, wherein the retarget layout is dissected into a plurality of segments, and the retarget layout comprises a first original pattern, a first adding pattern and a second adding pattern. Then, a computer is utilized to calculate a distance between adjacent parallel segments, if the distance is greater than a first predetermined value, processing a smooth process to modify the retarget layout to generate a smooth layout, wherein the smooth process comprises the step of: generating a second predetermined value ranging between a width of the first adding pattern and a width of the second adding pattern. After the smooth process, an optical proximity correction process is applied to the smooth layout to produce an optical proximity correction layout.

These and other objectives of the present invention will no doubt become obvious to those of ordinary skill in the art after reading the following detailed description of the preferred embodiment that is illustrated in the various figures and drawings.

DETAILED DESCRIPTION

The present invention is particularly applicable to a computer-implemented software-based IC design layout processing system for generating an IC design based on application.

Figure 1:
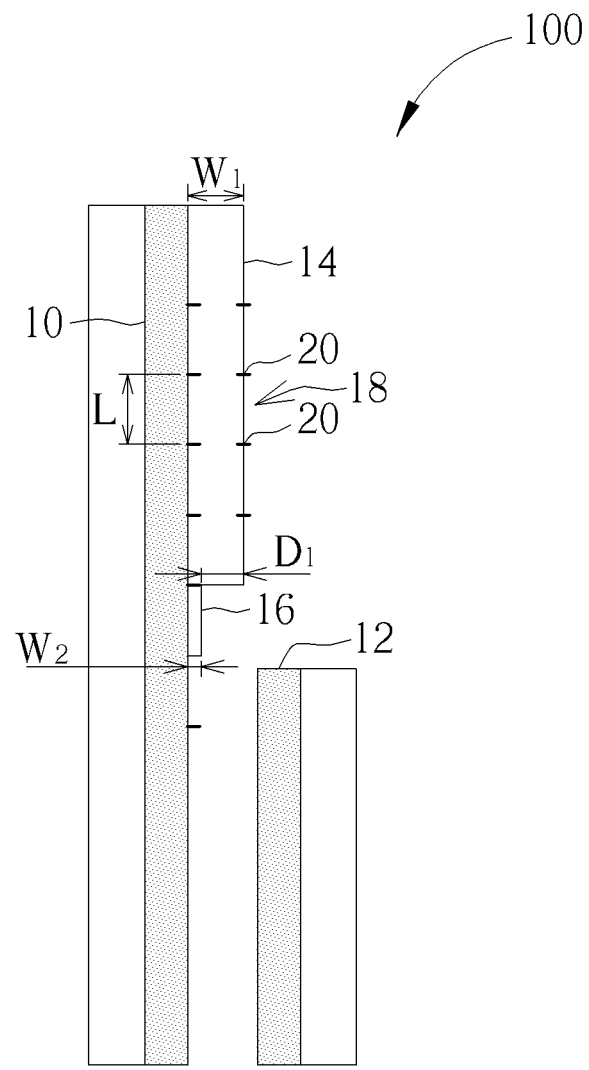
FIG. 1 illustrates a retarget layout according to a preferred embodiment of the present invention.

According to a preferred embodiment of the present invention, a method for optical proximity correction is provided as follows. First, a desired layout is provided. The desired layout represents the desired dimension of the image on the wafer. The desired layout is then modified by a pre-optical proximity correction (pre-OPC) process by using of a computer with simulation software to get a pre-OPC layout. During the pre-OPC process, some assist features are added to the edges of the desired layout, other steps such as merging database is also applied in a pre-OPC process. Latter, the pre-OPC layout is dissected and then retargeted to get a retarget layout as shown in FIG. 1. FIG. 1 illustrates a retarget layout according to a preferred embodiment of the present invention. The retarget process only creates patterns on the pre-OPC layout and does not modifying the pre-OPC layout. As shown in FIG. 1, a retarget layout 100 includes a first original pattern 10, a second original pattern 12, a first adding pattern 14 and a second adding pattern 16. Furthermore, the second original pattern 12 is disposed neighboring to the first original pattern 10, and the first original pattern 10 and the second original pattern 12 are parts of the pre-OPC layout. The first adding pattern 14 and the second adding pattern 16 are disposed along the first original pattern 10, and the first adding pattern 14 and the second adding pattern 16 are created after the retarget process performed to the pre-OPC layout. The first adding pattern 14 has a width $W_1$ and the second adding pattern 16 has a width $W_2$. The second adding pattern 16 connects to the first adding pattern 14. Moreover, the retarget layout 100 is dissected into numerous segments 18 by several dissection points 20. Each segment 18 has the same length L. The second adding pattern 16 preferably also has the length L.

Thereafter, a distance $D_1$ between adjacent parallel segments 18 is calculated by the computer. The distance $D_1$ extends in a direction perpendicular to the adjacent parallel segments 18. If the distance $D_1$ is greater than a first predetermined value, a smooth process is processed to modify the retarget layout 100. According to the preferred embodiment of the present invention, the first predetermined value is not less than half of a maximum retarget value, which is a constraint in the retarget process. Preferably, the distance $D_1$ is the difference between the width $W_1$ and the width $W_2$.

Figure 2A:
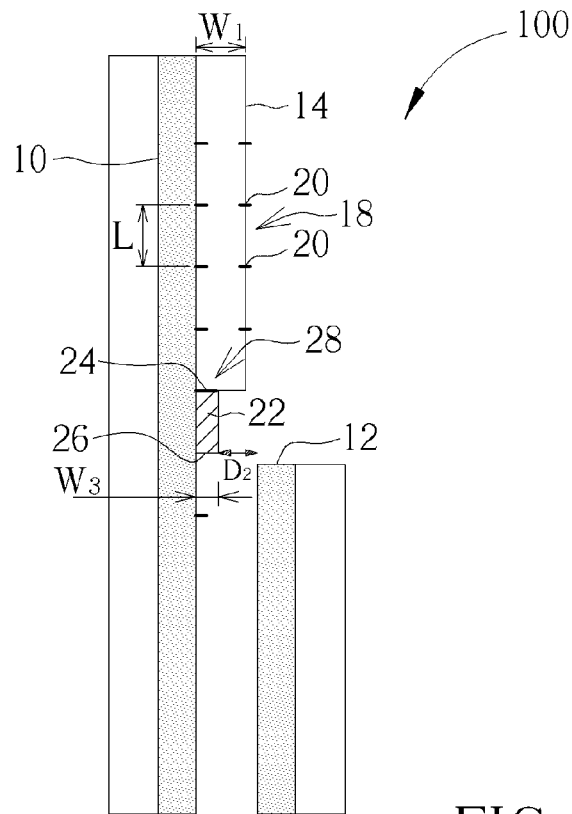
FIG. 2A and FIG. 2B illustrate two steps in a smooth process that may be employed according to a preferred embodiments of the invention.
Figure 2B:
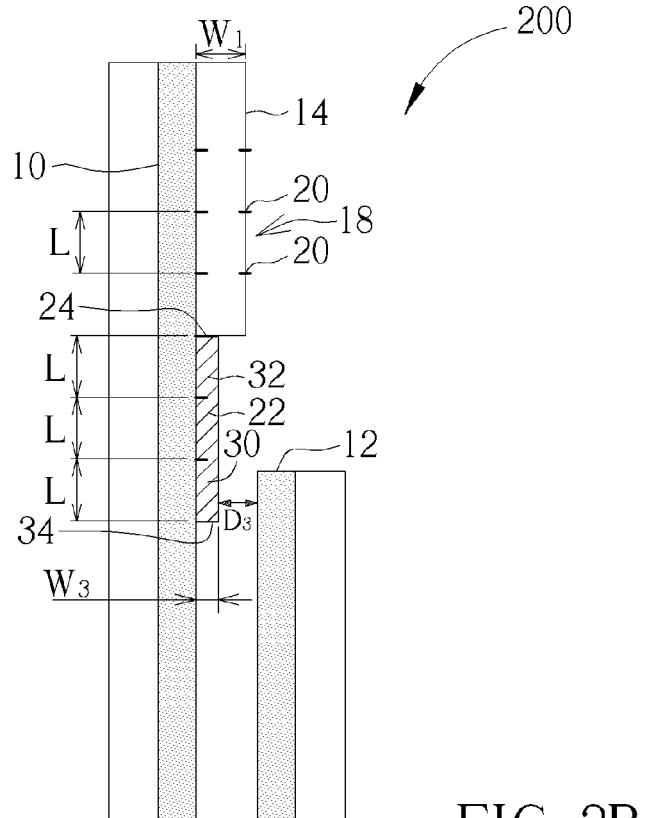

Two steps may be implemented at the smooth process. FIG. 2A and FIG. 2B illustrate two steps in a smooth process that may be employed according to a preferred embodiments of the invention. As shown in FIG. 2A, during the first smooth process, the second adding pattern 16 is changed to a first smooth pattern 22 having a width $W_3$ and the length L. The width $W_3$ is generated from the following formula:

the width $W_3$=(the width $W_1$ of the first adding pattern 14+the width $W_2$ of the second adding pattern 16)/a second predetermined value The second predetermined value may be any positive integer. In accordance with one preferred embodiment of the present invention, the second predetermined value is 2. The first smooth pattern 22 has a same length as the segment 18 has. In other words, the length L of first smooth pattern 22 is substantially equal to the length L of the segment 18. The first smooth pattern 22 has a bottom 26 and a top 24. The top 24 of the first smooth pattern 22 connects to a tail portion 28 of the first adding pattern 14. The tail portion 28 also has length L. The bottom 26 of the first smooth pattern 22 is preferably kept a distance $D_2$ away from the second original pattern 12. The distance $D_2$ is not less than a minimum space design rule Later, as shown in FIG. 2B, a second smooth process is performed to add a second smooth pattern 30 extending from the bottom 26 of the first smooth pattern 22 and shrink the tail portion 28 of the first adding pattern 14 to a third smooth pattern 32. Please refer to FIG. 2A for the position of the bottom 26 of the first smooth pattern 22 and the tail portion 28 of the first adding pattern 14. At this point, the smooth process is finished. It should be noted that the first smooth pattern 22, the second smooth pattern 30 and the third smooth pattern 32 have the same width, which is equal to the width $W_3$. The first smooth pattern 22, the second smooth pattern 30 and the third smooth pattern 32 have the same length, which is equal to the length L. Furthermore, a bottom 34 of the second smooth pattern 30 is preferably kept a distance $D_3$ away from the second original pattern 12. The distance $D_3$ is not less than the minimum space design rule.

After the smooth process, a smooth retarget layout 200 is generated. The distance $D_3$ may be equal to the distance $D_2$. The distance $D_2$ and distance $D_3$ may be determined by the critical dimension of the layout design.

Figure 3:
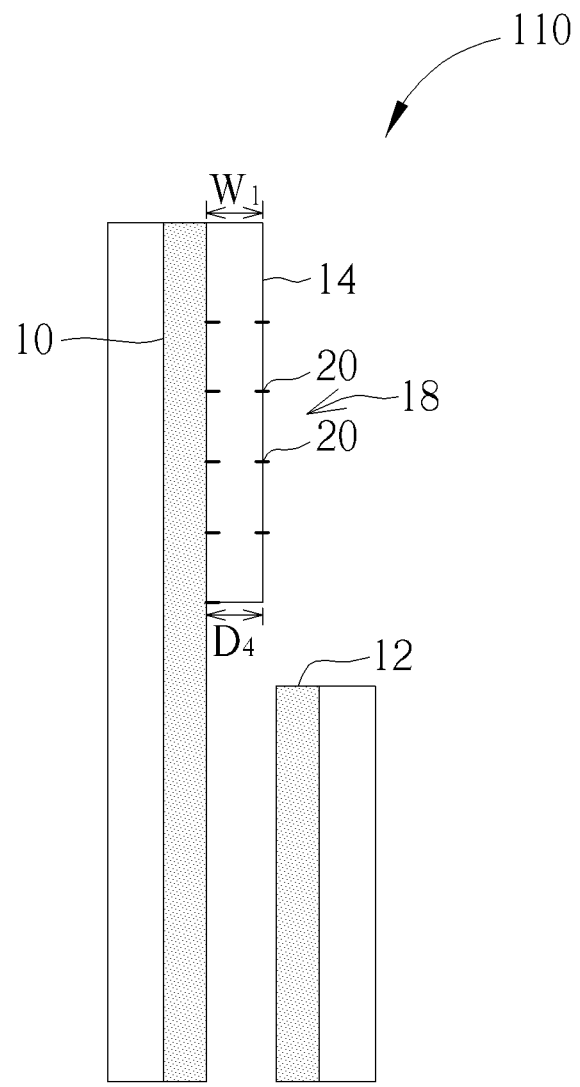
FIG. 3 illustrates a retarget layout according to another embodiment of the present invention.

FIG. 3 illustrates another embodiment in which the second adding pattern has a width equal to 0, wherein like reference numerals are used to refer to like elements throughout. As shown in FIG. 3, a retarget layout 110 is provided according to another preferred embodiment of the present invention. The difference between the retarget layouts 100/110 in FIG. 1 and FIG. 3 is that the width $W_2$ of the second adding pattern (not shown in FIG. 3) in FIG. 3 is equal to 0. In this embodiment, because the second original pattern 12 may be too close to the first original pattern 10, in this way the second adding pattern may be merged with the second original pattern 12 if the second adding pattern is still disposed besides the first original pattern 10. Therefore, there is no second adding pattern in the retarget layout 110 for considering the quality of resolution. Other elements in FIG. 3 have the same size and the same position as that in FIG. 1, therefore, an explanation is omitted.

Latter, a distance $D_4$ between adjacent parallel segments 18 is calculated by the computer. If the distance $D_4$ is greater than the first predetermined value, a smooth process is processed to modify the retarget layout 110. As illustrated above, the first predetermined value is not less than half of a maximum retarget value. Preferably, the distance $D_4$ is the width $W_1$ of the first adding pattern 14.

Similarly, two steps smooth process are performed as shown in FIG. 2A and FIG. 2B. Please refer to FIG. 2A, in a first smooth process, a first smooth pattern 22 having a width $W_3$ and a length L is added to extend from the first adding pattern 14. The method for calculating the width $W_3$ is already described in the previous paragraphs. Later, as shown in FIG. 2A and FIG. 2B, a second smooth process is performed to add a second smooth pattern 30 extending from the bottom 26 of the first smooth pattern 22 and shrink the tail portion 28 of the first adding pattern 14 to a third smooth pattern 32. The width $W_3$ of the second smooth pattern 30 and that of the third smooth pattern 32 are described the previous paragraphs and will not be described in detail here. After the smooth process, a smooth retarget layout 200 is generated.

Then, an optical proximity correction (OPC) process is applied to the smooth retarget layout 200 to generate an OPC layout. Later, the OPC layout can be output onto a photo mask. The OPC process sets the smooth retarget layout 200 as a desired target. That is, the lithographic process that will be used to manufacture the integrated circuit is simulated to determine if the simulated printed image matches the smooth retarget layout 200. Modifications are made to the layout design based upon the simulation results, and the lithographic process is simulated again. This OPC process is repeated until the simulated printed image significantly corresponds to the smooth retarget layout 200, or until the optical proximity correction process has converged.

Figure 4:
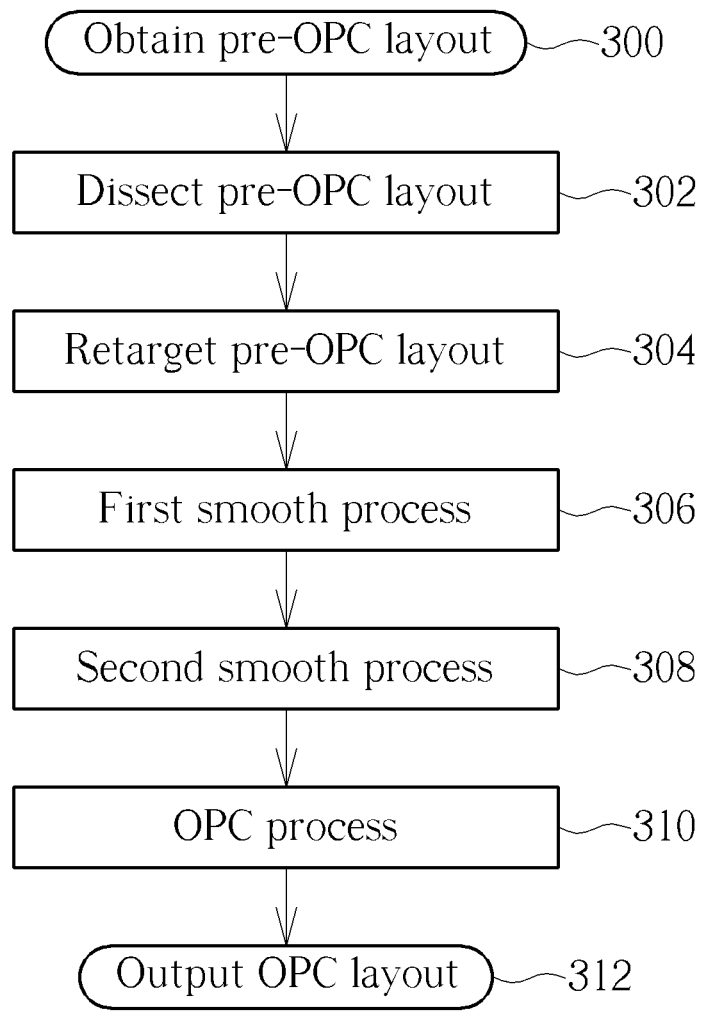
FIG. 4 is a flow diagram illustrating a method for optical proximity correction of present invention.

FIG. 4 is a flow diagram illustrating a method for optical proximity correction of present invention. As shown in FIG. 4, a pre-OPC layout is obtained, as indicated by a step 300. Next, the pre-OPC layout is dissected, as indicated by a step 302. Then, the pre-OPC layout is retargeted to get a retarget layout, as indicated by a step 304. Subsequently, a first smooth process is applied to the retarget layout, as indicated by a step 306. Later, a second smooth process is applied to the retarget layout after the first smooth process to get a smooth retarget layout, as indicated by a step 308. Thereafter, an OPC process is applied to the smooth retarget layout to get an OPC layout, as indicated by a step 310. Finally, the OPC layout is output, as indicated by a step 312.

Figure 5:
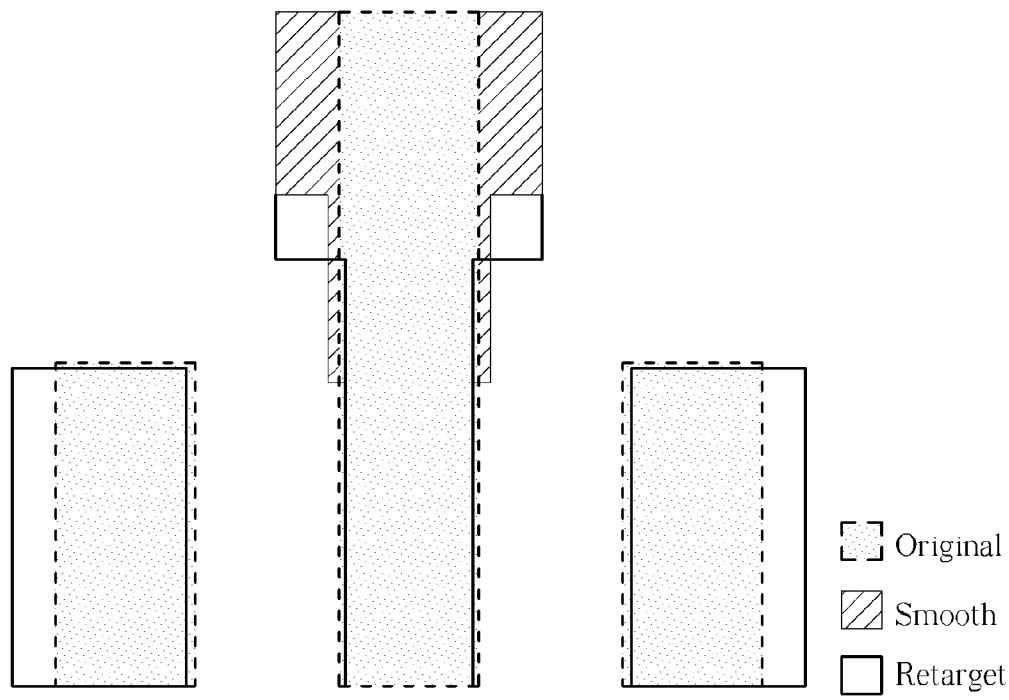
FIG. 5 illustrates a layout modified by a smooth process provided in the present invention.
Figure 6:
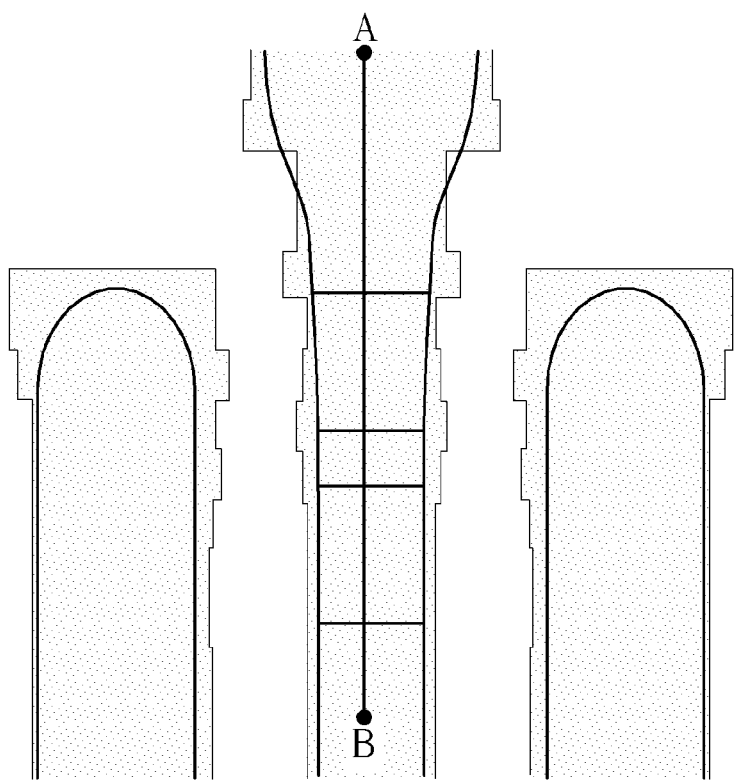
FIG. 6 illustrates an OPC process applied to the layout in FIG. 5.
Figure 7:
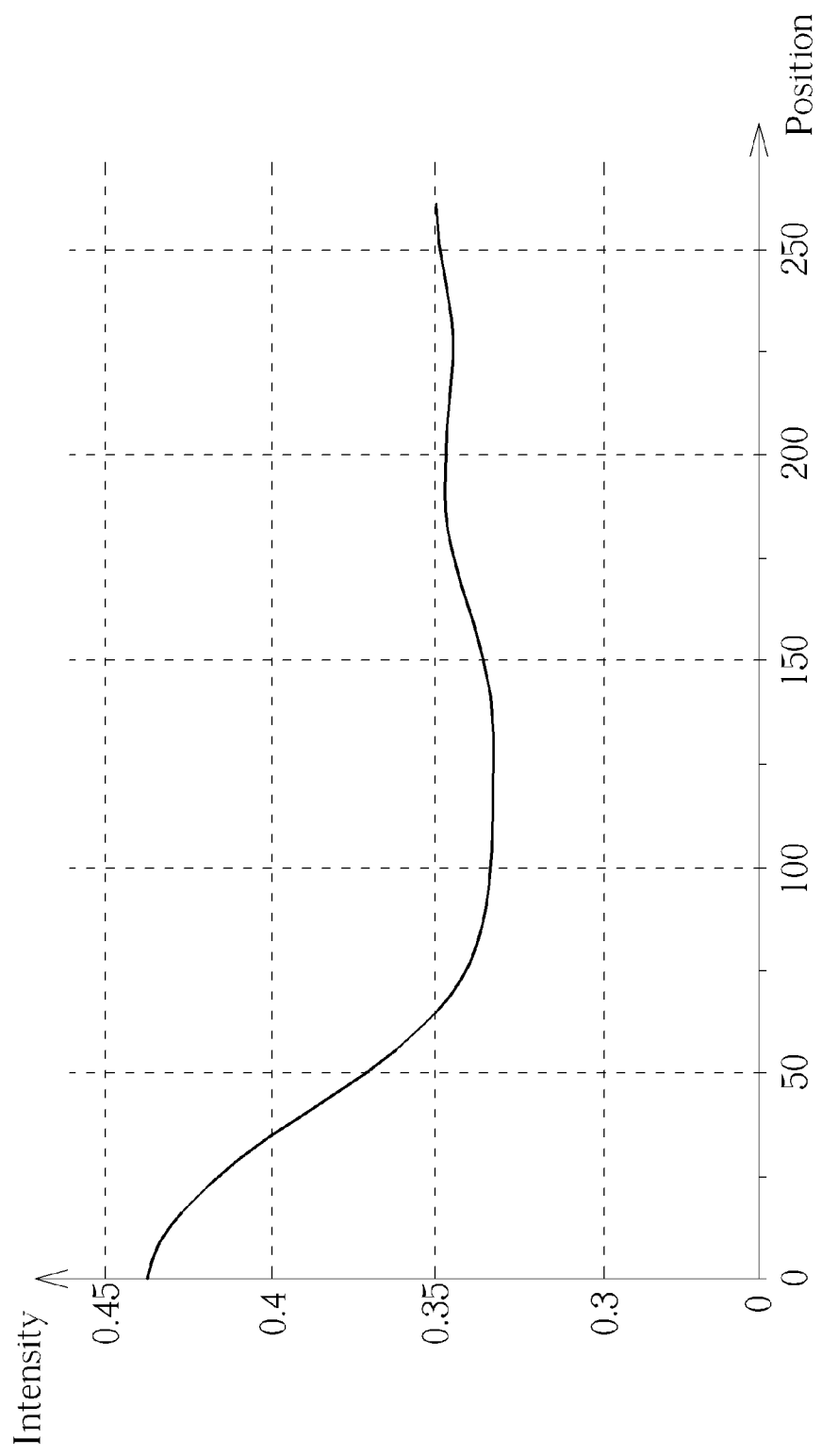
FIG. 7 illustrates a plot of intensity versus position based on the layout in FIG. 6.

FIG. 5 illustrates a layout modified by the smooth processes provided in the present invention. As shown in FIG. 5, an original pattern is shown by dots framed by dashed lines. A smooth pattern is shown by slashes framed by lines. A retarget pattern is shown by blank framed by thick lines. FIG. 6 illustrates an OPC process applied to the layout in FIG. 5. FIG. 7 illustrates a plot of intensity versus position based on the layout in FIG. 6. The curve in FIG. 7 represents the variation of intensity from the point A to point B in FIG. 6.

Figure 8:
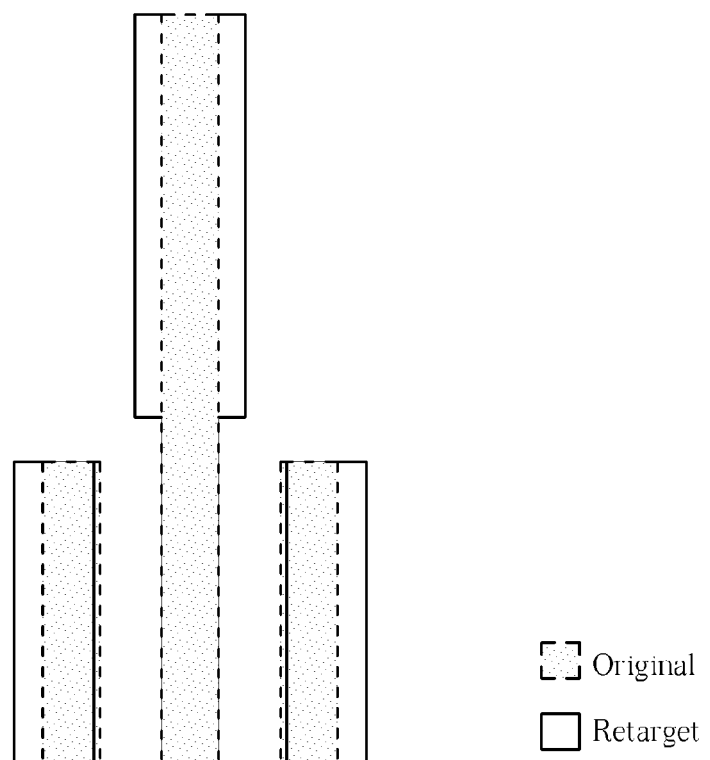
FIG. 8 illustrates a layout modified only by a retarget process.
Figure 9:
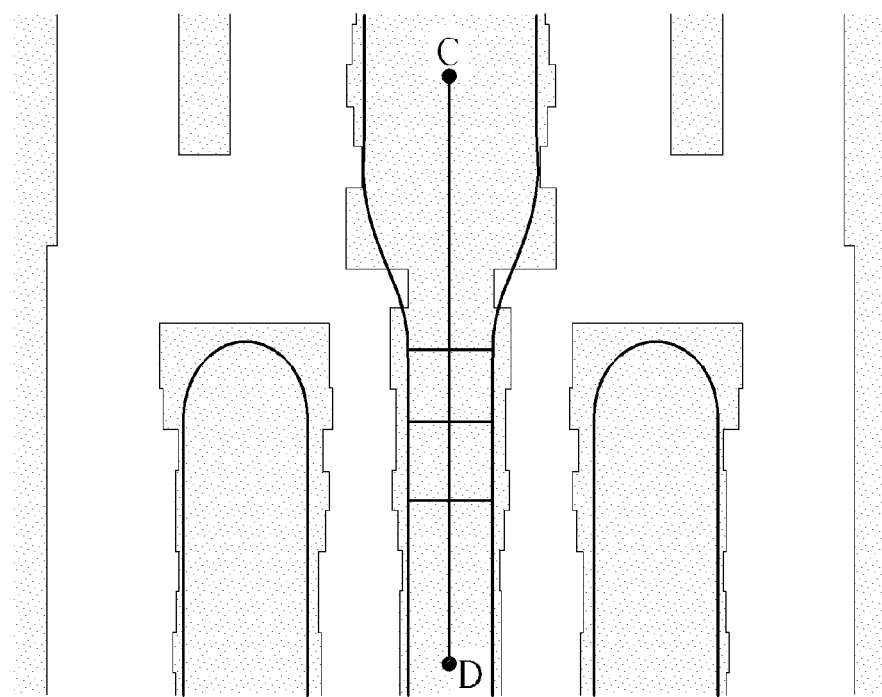
FIG. 9 illustrates an OPC process applied to the layout in FIG. 8.
Figure 10:
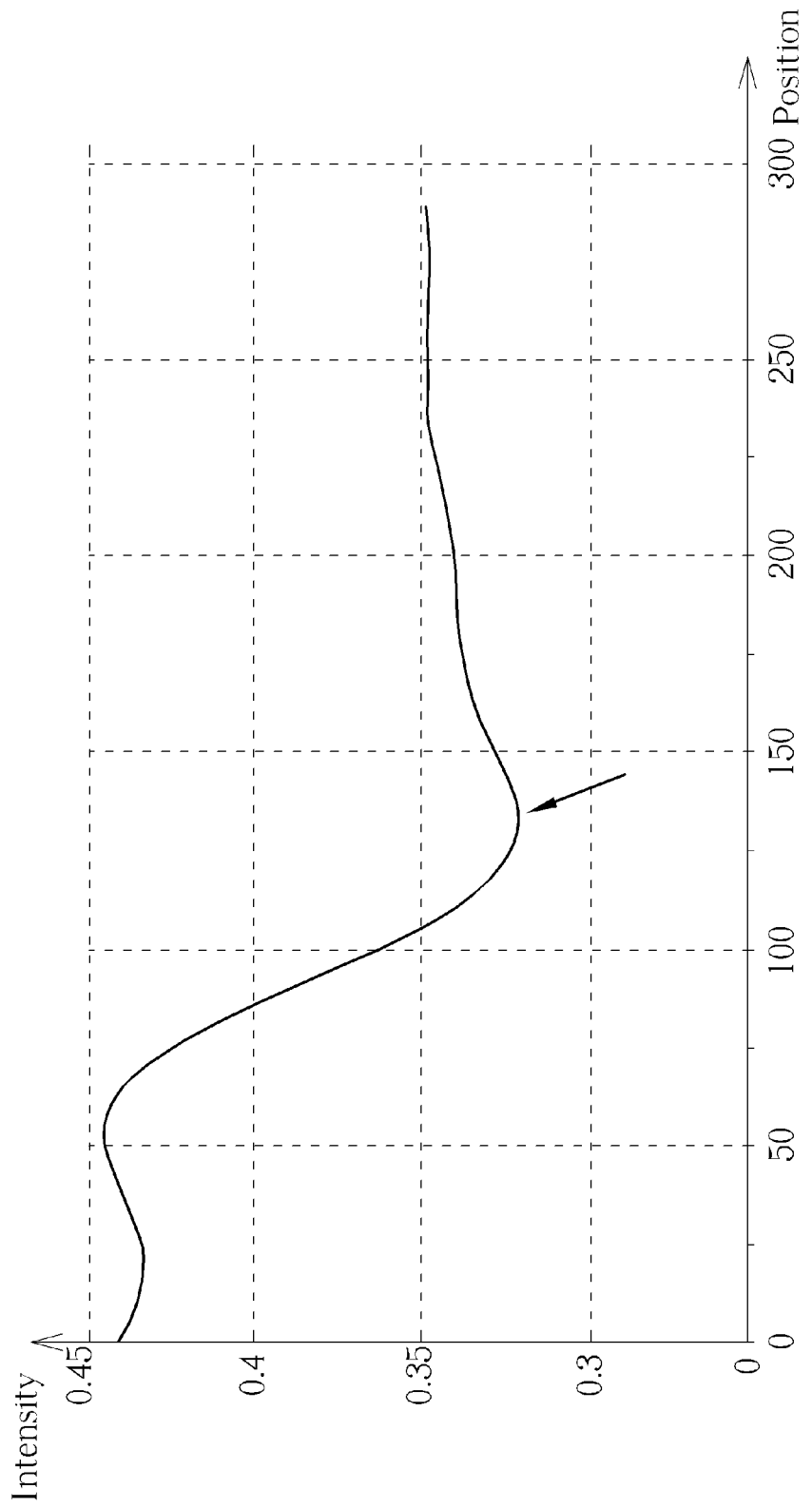
FIG. 10 illustrates a plot of intensity versus position based on the layout in FIG. 9.

FIG. 8 illustrates a layout modified only by a retarget process. As shown in FIG. 8, an original pattern is shown by dots framed by dashed lines. A retarget pattern is shown by blank framed by thick lines. FIG. 9 illustrates an OPC process applied to the layout in FIG. 8. FIG. 10 illustrates a plot of intensity versus position based on the layout in FIG. 9. The curve in FIG. 10 represents the variation of intensity from the point C to point D in FIG. 9. Comparing the curves in FIG. 7 and FIG. 10, the curve in FIG. 7 is smoother than that in FIG. 10. The curve in FIG. 10 has a concave, which is pointed by an arrow. The image intensity around the arrow is decreased rapidly. Based on FIG. 7 and FIG. 10, it can be concluded that the layout modified by the smooth process provided in the present invention has more uniform image intensity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for optical proximity correction, comprising:
   obtaining a retarget layout after a retarget process, wherein the retarget layout is dissected into a plurality of segments, and the retarget layout comprises a first original pattern, a first adding pattern and a second adding pattern;
   using a computer to calculate a distance between adjacent parallel segments, if the distance is greater than a first predetermined value, processing a smooth process to modify the retarget layout to generate a smooth layout, wherein the smooth process comprises the steps of:
   (a) changing the second adding pattern to a first smooth pattern; and
   (b) adding a second smooth pattern extending from a bottom of the first smooth pattern and shrinking a tail portion of the first adding pattern to a third smooth pattern, and the tail portion of the first adding pattern connecting to a top of the first smooth pattern; and
   applying an optical proximity correction process to the smooth layout to produce an optical proximity correction layout.

2. The method for optical proximity correction of claim 1, wherein the distance extends in a direction perpendicular to the adjacent parallel segments.

3. The method for optical proximity correction of claim 1, wherein the first smooth pattern, the second smooth pattern and the third smooth pattern are of a same width and of a same length, and the length is equal to a length of one of the segments.

4. The method for optical proximity correction of claim 3, wherein the width is calculated from the following formula:

the width=(a width of the first adding pattern+a width of the second adding pattern)/a second predetermined value.

5. The method for optical proximity correction of claim 4, wherein the second predetermined value is 2.

6. The method for optical proximity correction of claim 1, wherein a width of the second adding pattern is 0.

7. The method for optical proximity correction of claim 1, wherein the retarget layout further includes a second original pattern disposed neighboring to the first original pattern.

8. The method for optical proximity correction of claim 7, wherein a distance between the second original pattern and the second smooth pattern is not less than a minimum space design rule.

9. The method for optical proximity correction of claim 1, wherein the first predetermined value is not less than half of a maximum retarget value.

10. The method for optical proximity correction of claim 1, further comprising before obtaining the retarget layout, a pre-optical proximity correction process is applied to the first original pattern.

11. The method for optical proximity correction of claim 1, further comprising after producing the OPC layout, the OPC layout is output onto a photo mask.

12. A method for optical proximity correction, comprising:
   obtaining a retarget layout after a retarget process, wherein the retarget layout is dissected into a plurality of segments, and the retarget layout comprises a first original pattern, a first adding pattern and a second adding pattern;
   using a computer to calculate a distance between adjacent parallel segments, if the distance is greater than a first predetermined value, processing a smooth process to modify the retarget layout to generate a smooth layout, wherein the smooth process comprises the step of:
   generating a second predetermined value ranging between a width of the first adding pattern and a width of the second adding pattern; and
   applying a optical proximity correction process to the smooth layout to produce an optical proximity correction layout.

13. The smooth retarget method for optical proximity correction of claim 12, wherein the smooth process further comprises the steps of
   changing the second adding pattern to a first smooth pattern; and
   adding a second smooth pattern extending from a bottom of the first smooth pattern and shrinking a tail portion of the first adding pattern to a third smooth pattern, and the tail portion of the first adding pattern connecting to a top of the first smooth pattern.

14. The method for optical proximity correction of claim 13, wherein the first smooth pattern, the second smooth pattern and the third smooth pattern are of a same width and of a same length, and the length is equal to a length of one of the segments.

15. The method for optical proximity correction of claim 12, wherein the second predetermined value is calculated from the following formula:

the second predetermined value=(a width of the first adding pattern+a width of the second adding pattern)/an integer.

16. The method for optical proximity correction of claim 15, wherein the integer is 2.

17. The method for optical proximity correction of claim 12, wherein a width of the second adding pattern is 0.

18. The method for optical proximity correction of claim 12, wherein the distance extends in a direction perpendicular to the adjacent parallel segments.

19. The method for optical proximity correction of claim 12, wherein the first predetermined value not less than half of a maximum retarget value.

20. The method for optical proximity correction of claim 12, further comprising after producing the optical proximity correction layout, the optical proximity correction layout is output onto a photo mask.

21. The method for optical proximity correction of claim 1, wherein the third smooth pattern is connected to the first smooth pattern, the first smooth pattern is connected to the second smooth pattern, and wherein the third smooth pattern, the first smooth pattern, and the second smooth pattern are disposed along a direction parallel to adjacent segments.

22. The smooth retarget method for optical proximity correction of claim 12, wherein the first adding pattern and the second adding pattern are disposed along the first original pattern in a direction parallel to adjacent segments, the second adding pattern connects to the first adding pattern.

* * * * *